United States Patent
Song et al.

(12) 
(10) Patent No.: US 6,526,654 B1
(45) Date of Patent: Mar. 4, 2003

(54) METHOD OF PRODUCING DOUBLE-SIDED CIRCUIT BOARD

(75) Inventors: Zhiyi Song, Kawasaki (JP); Kiyokazu Moriizumi, Kawasaki (JP); Kazuaki Satoh, Kawasaki (JP); Norikazu Ozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 280 days.

(21) Appl. No.: 09/606,008

(22) Filed: Jun. 29, 2000

(30) Foreign Application Priority Data

Nov. 9, 1999 (JP) ............................. 11-317746

(51) Int. Cl.7 ............................................. H05K 3/34
(52) U.S. Cl. .................. 29/840; 29/831; 29/846; 29/830; 29/832; 174/262; 174/264; 361/779; 361/792; 427/96; 427/554
(58) Field of Search ......................... 29/830, 831, 832, 29/837, 840, 842, 846, 852, 851; 174/262, 264, 266, 255, 260; 361/779, 792, 794, 795, 993; 427/96, 554

(56) References Cited

U.S. PATENT DOCUMENTS

| | | | | |
|---|---|---|---|---|
| 4,305,204 A | * | 12/1981 | Toggart et al. | .............. 156/242 |
| 5,218,368 A | * | 6/1993 | Huruno et al. | ........ 343/700 MS |
| 5,227,588 A | * | 7/1993 | Schreiber et al. | ............ 174/262 |
| 5,367,765 A | * | 11/1994 | Kusaka | ........................ 29/593 |
| 5,433,819 A | * | 7/1995 | McMeen | ..................... 216/105 |
| 5,527,998 A | * | 6/1996 | Anderson et al. | ............ 174/254 |
| 5,727,310 A | * | 3/1998 | Casson et al. | ................. 29/830 |
| 5,835,357 A | * | 11/1998 | Swamy et al. | .............. 174/260 |
| 5,837,155 A | * | 11/1998 | Inagaki et al. | ................ 216/18 |
| 5,870,289 A | * | 2/1999 | Tokuda et al. | .............. 174/260 |
| 5,882,957 A | * | 3/1999 | Lin | ............................. 438/126 |
| 6,228,467 B1 | * | 5/2001 | Taniguchi et al. | .......... 174/258 |

FOREIGN PATENT DOCUMENTS

JP      5-175657      7/1993

* cited by examiner

Primary Examiner—Carl J. Arbes
Assistant Examiner—Tai Nguyen
(74) Attorney, Agent, or Firm—Armstrong, Westerman & Hattori, LLP

(57) ABSTRACT

The method comprises forming a plurality of wiring pattern layers on the front surface of a substrate. In the process of forming the wiring pattern layers, an insulator protection film keeps covering over the wiring pattern on the back surface of the substrate. When the formation of the wiring pattern layers has been completed on the front surface of the substrate, a penetrating hole is bored in the cured or hardened insulator protection film. The penetrating hole may be utilized as a conductive via or a conductive through hole. A wiring pattern layer is then formed over the hardened insulator protection film on the back surface of the substrate. It is possible to omit an additional process for removing the insulator protection film. The method contributes to further facilitation of production process and further reduction in production cost.

12 Claims, 4 Drawing Sheets

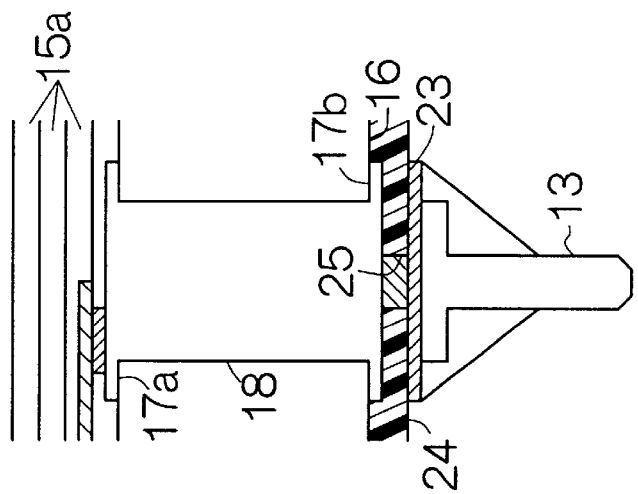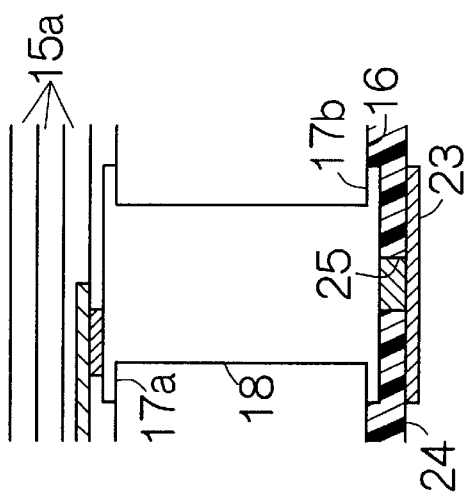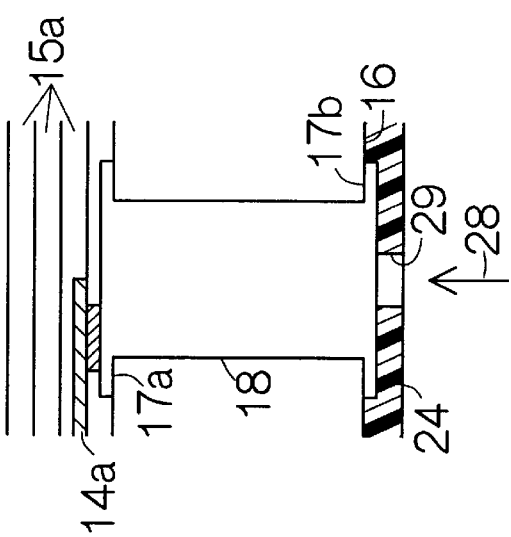

METHOD OF PRODUCING DOUBLE-SIDED CIRCUIT BOARD

BACKGROUND OF THE INVENTION

1. Field of the Invention

The present invention relates to a double-sided circuit board including conductive wiring patterns formed on front and back surfaces of a substrate.

2. Description of the Prior Art

A double-sided circuit board is designed to receive electronic components such as semiconductor chips, including chip resistors, chip capacitors, and the like, on the front and back surfaces of its substrate. As compared with the case where electronic components are mounted only on the front surface of a substrate, it is thus possible to improve the total amount of the mounted electronic components over a single substrate. Additional layers of thin film wiring pattern layers over the printed wiring pattern on the front surface of the substrate allow establishment of relatively complicated electric connections or circuits between the mounted electronic components.

As is disclosed in Japanese Patent Application Laid-open No. 5-175657, when the layers of conductive wiring patterns are sequentially formed over the front surface of the substrate, it is necessary to cover and protect a printed wiring pattern on the back surface of the substrate. If the printed wiring pattern on the back surface is exposed to an electrolyte in an electroplating bath, for example, in the process of forming the layers of the wiring patterns on the front surface of the substrate, the printed wiring pattern on the back surface inevitably suffers from electric connections or short circuits induced by unnecessary electroplated film or layer.

The aforementioned Japanese Patent Application Laid-open No. 5-175657 discloses a method employing a protection layer of polyimide designed to keep covering over the back surface of the substrate in the process of forming layers of wiring patterns on the front surface of the substrate. The protection layer of polyimide serves to release the method from repeated formation of a protection layer every time a resist film for forming a layer of wiring pattern is removed from the front surface of the substrate. The process can thus be facilitated. However, the disclosed method is required to completely remove the protection layer of polyimide by using an RIE (Reactive Ion Etching) process or else before another wiring pattern is formed over the printed wiring pattern on the back surface of the substrate.

SUMMARY OF THE INVENTION

It is accordingly an object of the present invention to provide a method of producing a double-sided circuit board capable of eliminating a process of removing a protection layer so as to contribute to further facilitation of production process and reduction in production cost.

According to the present invention, there is provided a method of producing a double-sided circuit board including wiring patterns over front and back surfaces of a substrate, comprising: sticking an insulator protection film on the back surface of the substrate prior to formation of a thin film wiring pattern layer over the front surface of the substrate; and mounting an electronic component on the back surface of the substrate, keeping the insulator protection film clinging to the back surface of the substrate, after the formation of the thin film wiring pattern layer.

The method is designed to finally provide double-sided circuit board including the insulator protection film which has served to protect the wiring pattern over the back surface of the substrate in the process of forming the thin film wiring pattern layer on the front surface of the substrate. It is not necessary to subject the substrate to an additional process for removing the insulator protection film before mounting of the electronic component on the back surface of the substrate. The method may contribute to further facilitation of production process and further reduction in production cost. In particular, such a method can be employed when any conductive thin film pattern is not necessarily formed over the wiring pattern on the back surface of the substrate. The electronic component may include an input/output pin, a chip resistor, a chip capacitor, and the like, for example.

In general, a plurality of thin film pattern layers may be formed over the front surface of the substrate after the formation of the insulator protection film. The thin film pattern layers on the wiring pattern over the front surface of the substrate serve to establish a complicated electric connections or circuits between the electronic components mounted on the front and back surfaces of the substrate.

In addition, the method may further comprise subjecting the insulator protection film to a dry process so as to bore a penetrating hole through the insulator protection film when the electronic component is to be mounted. The penetrating hole may be utilized as a conductive via or a conductive through hole. The thus formed via or through hole is designed to establish a reliable electric connection between the electronic component on the insulator protection film and the wiring pattern over the back surface of the substrate.

Such a dry process may employ radiation of a laser beam, for example. In general, when a conductive thin film pattern is not necessarily formed on the wiring pattern on the back surface of the substrate, a laser beam may have ability enough to form a pattern or penetrating hole at a required dimensional accuracy for electrically connect the mounted electronic component and the wiring pattern to each other on the back surface of the substrate. It should be noted that such a dry process may employ any other means for forming a penetrating hole or the like.

According to a second aspect of the present invention, there is provided a method of producing a double-sided circuit board including wiring patterns over front and back surfaces of a substrate, comprising: forming an insulator protection film on the back surface of the substrate prior to formation of a thin film wiring pattern layer over the front surface of the substrate; forming at least a thin film wiring pattern layer over the front surface of the substrate, keeping the insulator protection film on the back surface of the substrate; and boring a penetrating hole through the insulator protection film clinging to the back surface of the substrate.

The method is designed to finally provide double-sided circuit board including the insulator protection film which has served to protect the wiring pattern over the back surface of the substrate in the process of forming the thin film wiring pattern layer on the front surface of the substrate in the aforementioned manner. It is not necessary to subject the substrate to an additional process for removing the insulator protection film before mounting of the electronic component on the back surface of the substrate. The method may contribute to further facilitation of production process and further reduction in production cost.

BRIEF DESCRIPTION OF THE DRAWINGS

The above and other objects, features and advantages of the present invention will become apparent from the following description of the preferred embodiment in conjunction with the accompanying drawings, wherein:

FIGS. 5A to 5C are partially enlarged sectional views of the double-sided circuit board for illustrating the process of forming a via in an insulator layer on the back surface of the substrate according to a dry process.

DESCRIPTION OF THE PREFERRED EMBODIMENT

Figure 1:
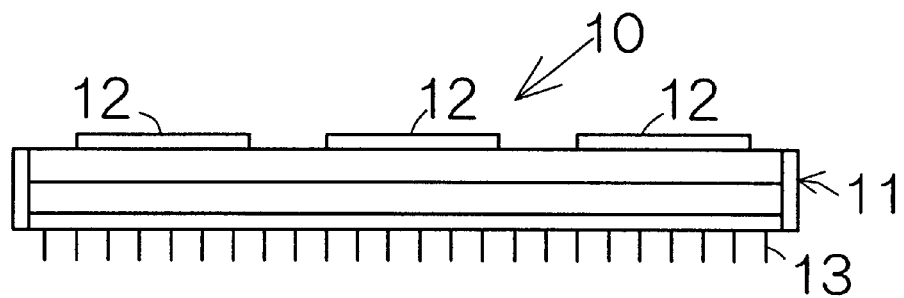
FIG. 1 schematically illustrates a side view of a printed circuit board unit.
Figure 2:
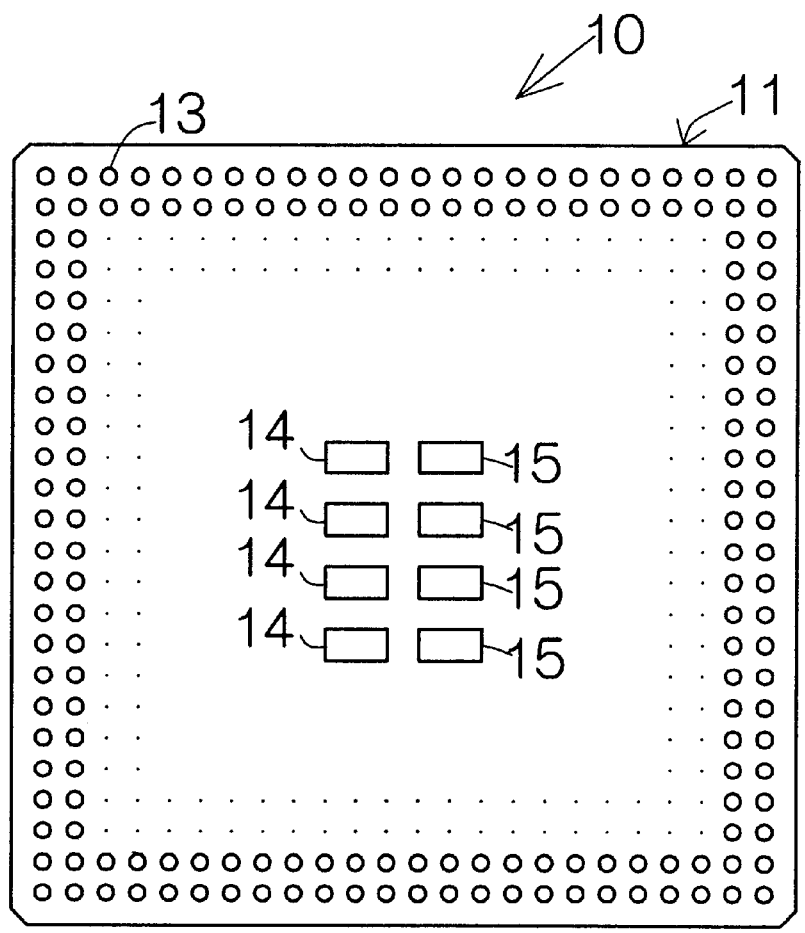
FIG. 2 illustrates the back surface of the printed circuit board unit.

FIG. 1 schematically illustrates a printed circuit board unit 10. The printed circuit board unit 10 comprises a double-sided multilayered circuit board 11 according to the present invention. A plurality of semiconductor chips 12 are, for example, mounted on the front surface of the double-sided multilayered circuit board 11. A plurality of input/output pins 13 are mounted on the back surface of the double-sided multilayered circuit board 11. The input/output pins 13 are designed to establish electric path between the semiconductor chips 12 and a printed wiring pattern on a larger main board or motherboard, not shown, when the double-sided multilayered circuit board 11 has been mounted on the larger main board. As is apparent from FIG. 2, electronic components such as chip resistors 14, chip capacitors 15, and the like, in addition to electronic components such as the aforementioned input/output pins 13, may be mounted on the back surface of the double-sided multilayered circuit board 11.

Figure 3:
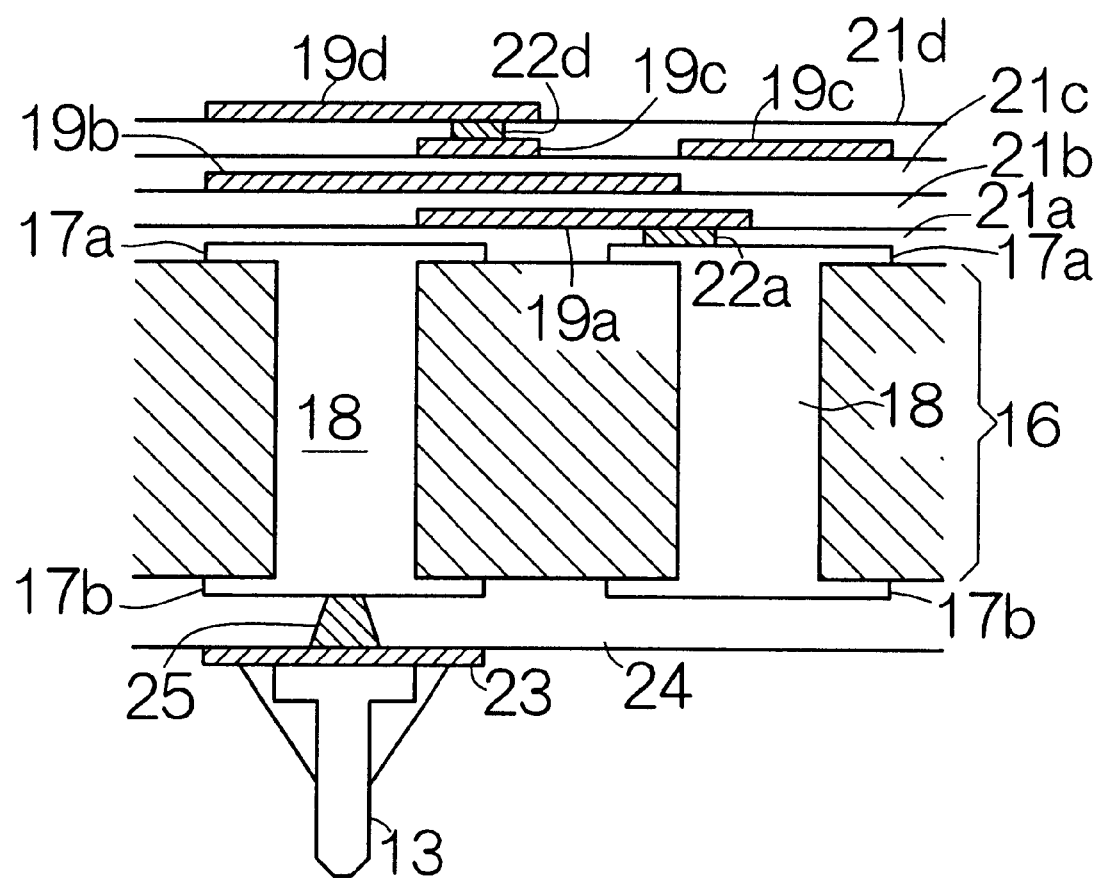
FIG. 3 is a partially enlarged sectional view schematically illustrating the structure of a double-sided circuit board.

As shown in FIG. 3, the double-sided multilayered circuit board 11 includes a ceramic substrate 16, for example. Conductive wiring patterns 17a, 17b are formed to extend over the front and back surfaces of the substrate 16. As conventionally known, the wiring patterns 17a, 17b may be electrically connected to each other through a conductive via 18 formed in the substrate 16.

One or more conductive thin film pattern layers or wiring pattern layers 19a–19d are formed above the wiring pattern 17a on the front surface of the substrate 16. An insulator layer 21a serves to electrically isolate or insulate the wiring pattern layer 19a from the wiring pattern 17a. Likewise, respective insulator layers 21b–21d function to electrically isolate or insulate the adjacent wiring pattern layers 19a–19d from one another. Vias 22a, 22d . . . may be formed in the respective insulator layers 21a–21d, for example, so as to establish electric connection between the wiring pattern 17a and the wiring pattern layer 19a and between the wiring pattern layers 19a–19d.

At least one conductive thin film pattern layer or wiring pattern layer 23 is formed below the wiring pattern 17b on the back surface of the substrate 16. An insulator layer 24 serves to electrically isolate or insulate the wiring pattern layer 23 from the wiring pattern 17b. A via 25 may be formed in the insulator layer 24, for example, so as to establish electric connection between the wiring pattern 17b and the wiring pattern layer 23. The input/output pin 13 is mounted on the wiring pattern layer 23, for example. In this case, the wiring pattern layer 23 may comprise an input/output pad for receiving the input/output pin 13 thereon. It should be noted that the wiring pattern layer 23 need not be formed on the surface of the insulator layer 24. The via 25 formed in the insulator layer 24 can establish electric connection between the wiring pattern 17b and the input/output pin 13 without the wiring pattern layer 23. Moreover, any electronic components such as the input/output pins 13 need not be mounted on the wiring pattern layer 23.

Now, a description will be made on a method of producing the double-sided multilayered circuit board 11. The ceramic substrate 16 is first prepared. As conventionally known, a conductive or metallic base layer is formed on the front and back surfaces of the substrate 16 by sputtering or the like. A fluid photoresist such as a sensitive acrylic resistor the like is applied to the surfaces of the respective metallic base layers on the front and back surfaces of the substrate 16. The applied photoresist is then subjected to exposure and development so as to form a photoresist film. When the photoresist is exposed, a mask is employed to define a void or aperture pattern corresponding to the shape of the wiring pattern 17a, 17b.

After the photoresist film has been formed, the substrate 16 is dipped in an electrolyte or in an electroplating bath. When an electric current is supplied to the metallic base layer, a deposit is allowed to grow from the exposed surfaces of the metallic base layer between the photoresist film. The deposit thus forms the wiring patterns 17a, 17b. The photoresist film and unnecessary metallic base layer are then removed. The deposit may be of copper.

Figure 4C:
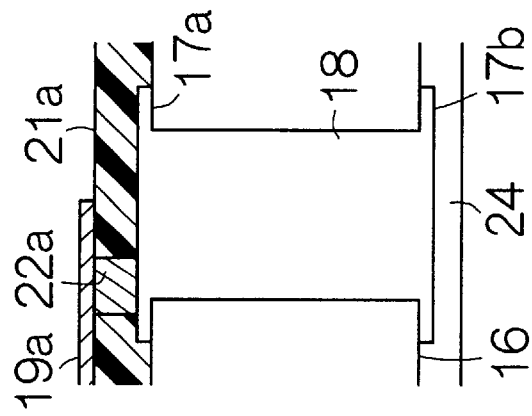
FIGS. 4A to 4C are partially enlarged sectional views of the double-sided circuit board for illustrating the process of forming wiring pattern layers on the front surface of the substrate.
Figure 4B:
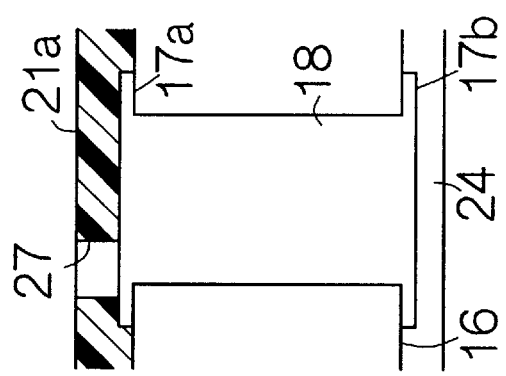
Figure 4A:
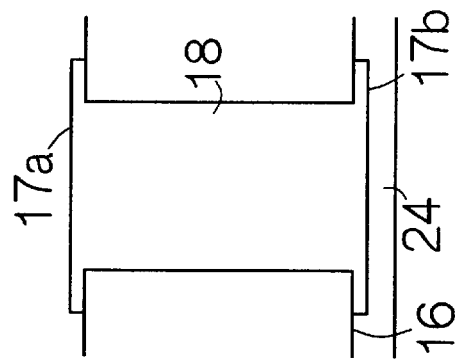

Subsequently, a fluid polyimide is applied to the back surface of the substrate 16 over the thus formed wiring pattern 17b, for example. The applied polyimide is subjected to a hard baking treatment at a higher temperature extending between 300–400° C., for example, until the polyimide is completely cured. As a result, a protection layer or insulator layer 24 can be obtained to cover over the wiring pattern 17b, as shown in FIG. 4A, for example. It should be noted that any material, other than polyimide, can be employed to form the insulator layer 24 as long as the insulator layer 24 can be prevented from dropping off the wiring pattern layer 17b irrespective of application of a reactive agent or solution such as a developer. In other words, the material is only required to allow the insulator layer 24 to remain on the back surface of the substrate 16 in process of forming the wiring pattern layers 19a–19d on the front surface of the substrate 16.

Likewise, a fluid polyimide is applied to all over the front surface of the substrate 16, for example. The applied polyimide is then subjected to a pre-baking treatment at a lower temperature of 60° C., for example, until the polyimide is half cured. The half-cured polyimide is thereafter subjected to exposure and development. When the polyimide is exposed, a mask is employed to define a void or aperture pattern corresponding to the shape of the via 24a. Development after the exposure allows a penetrating hole to be bored in the half-cured polyimide. The half-cured polyimide is then subjected to a hard baking treatment at a higher temperature extending between 300–400° C., for example, until the polyimide is completely cured. As a result, an insulator layer 21a can be obtained to define the penetrating hole 27 therein, as shown in FIG. 4B, for example.

A conductive or metallic base layer is formed on the surface of the insulator layer 21a in the aforementioned manner. A fluid photoresist likewise applied to the surface of the metallic base layer is then subjected to exposure and development so as to provide a photoresist film. When the photoresist is exposed, a mask is employed to define a void or aperture pattern corresponding to the shape of the wiring pattern layer 19a. Thereafter, the substrate 16 is dipped in an electrolyte. When an electric current is supplied to the metallic base layer, a deposit is allowed to grow from the exposed surfaces of the metallic base layer between the photoresist film. The deposit thus forms the wiring pattern layer 19a, as shown in FIG. 4C, for example. At the same time, the via 22a has been formed in the penetrating hole 27 so as to electrically connect the wiring pattern layer 19a and the wiring pattern 17a. The photoresist film and unnecessary metallic base layer are then removed.

During formation of the wiring pattern layer 19a in the above manner, the protection layer or insulator layer 24 keeps covering over the wiring pattern 17b on the back surface of the substrate 16. The wiring pattern 17b is prevented from contacting the electrolyte. Accordingly, even if the wiring pattern 17b is connected to the wiring pattern 17a through the via 18, a deposit is prevented from growing from the wiring pattern 17b. In addition, since the wiring pattern 17b can reliably be isolated from a reactive agent or solution such as the developer for removing the photoresist film, the wiring pattern 17b can be prevented from corrosion or the like.

Again, a fluid polyimide is applied to the surface of the insulator layer 21a on which the wiring pattern layer 19a has been formed. The applied polyimide is then subjected to a pre-baking treatment at a lower temperature in the aforementioned manner, and the half-cured polyimide is thereafter subjected to exposure and development. When the half-cured polyimide is exposed, a mask is employed to define a void or aperture pattern corresponding to the shape of a conductive via, not shown, for connecting the wiring pattern layers 19a, 19b to each other. When the half-cured polyimide is subjected to a hard baking treatment at a higher temperature until the polyimide is completely cured, the insulator layer 21b can be obtained to define a penetrating hole therein in the aforementioned manner.

During the above-described process, the wiring pattern 17b is likewise prevented from contacting the electrolyte. Accordingly, the substrate 16 may suffer from no growth of an unnecessary deposit and no corrosion. In addition, since the formerly formed insulator layer 24 can be maintained, it is not necessary to repeat formation of insulator layers for covering over the wiring pattern 17b every time the respective wiring pattern layers 19a–19d are to be formed. This may contribute to facilitation of production process and reduction in production cost.

The formation of wiring pattern layer and the insulator layer is sequentially repeated in the above-described manner. In this way, the wiring pattern layers 19a–19d and the insulator layers 21b–21d are alternately formed on the front surface of the substrate 16. Layers of wiring pattern 19a–19d are thus obtained.

When the formation of the wiring pattern layers 19a–19d has been completed on the front surface of the substrate 16, electronic components such as the input/output pins 13, the chip resistors 14, the chip capacitors 15, and the like are to be mounted on the back surface of the substrate 16. A penetrating hole 29 is formed in the insulator layer 24 by using a laser beam 28, as shown in FIG. 5A. When the penetrating hole 29 has been bored, a conductive or metallic base layer is formed on the surface of the insulator layer 24 in the aforementioned manner. A photoresist film is then formed on the metallic base layer, for example. The formed photoresist film is thereafter subjected to exposure and development. When the photoresist film is exposed, a mask is employed to define a void or aperture pattern corresponding to the shape of the wiring pattern layer 23. After the exposure and development, when an electric current is supplied to the metallic base layer in the electroplating bath, a deposit is allowed to grow from the exposed surfaces of the metallic base layer between the photoresist film. The wiring pattern layer 23 can thus be obtained as shown in FIG. 5B. The via 25 is formed within the penetrating hole 29 so as to connect the wiring pattern layer 23 and the wiring pattern 17b to each other. The photoresist film and unnecessary metallic base layer are then removed. As shown in FIG. 5C, the thus formed wiring pattern layer 23 is designed to finally receive the input/output pins 13, the chip resistors 14, the chip capacitors 15, and the like.

In the above-described manner, the method of producing the double-sided multilayered circuit board 11 is designed to finally form the insulator layer 24 which has served as the protection layer covering over the wiring pattern 17b on the back surface of the substrate 16 in the process of forming the wiring pattern layers 19a–19d on the front surface of the substrate 16. In other words, the protection layer clinging to the back surface of the substrate 16 can be diverted to the final insulator layer 24. It is not necessary to completely remove the protection layer for covering over the wiring pattern 17b, so that further facilitation of production process and further reduction in production cost can be achieved.

In general, when a fine wiring pattern layer similar to the wiring pattern layers 19a–19d is to be formed on the back surface of the substrate 16, a photoresist film is required to define a void or aperture pattern corresponding to the fine wiring pattern layer at a higher accuracy. Prior to formation of such a photoresist film, the protection layer or insulator layer 24 must be completely removed. On the other hand, if the electronic components such as the input/output pins 13, the chip resistors 14, the chip capacitors 15, and the like are solely to be mounted on the back surface of the substrate 16, it is not necessary to form the fine wiring pattern layer on the back surface of the substrate 16 at a higher accuracy. A laser beam may have ability enough to form a pattern or the penetrating holes at a required dimensional accuracy for electrically connect the mounted electronic components and the wiring pattern 17b to each other. In other words, even if the protection layer or insulator layer 24 keeps clinging to the back surface of the substrate 16, electronic components can reliably be mounted on the back surface of the substrate 16 in a facilitated manner.

What is claimed is:

1. A method of producing a double-sided circuit board including wiring patterns over front and back surfaces of a substrate, comprising:
   sticking an insulator protection film on the back surface of the substrate prior to formation of a thin film wiring pattern layer over the front surface of the substrate; and
   mounting an electronic component on the back surface of the substrate, keeping the insulator protection film clinging to the back surface of the substrate, after the formation of the thin film wiring pattern layer.

2. The method of producing a double-sided circuit board according to claim 1, further comprising subjecting the insulator protection film to a dry process so as to bore a penetrating hole through the insulator protection film when the electronic component is to be mounted.

3. The method of producing a double-sided circuit board according to claim 2, wherein a laser beam is employed to bore the penetrating hole.

4. The method of producing a double-sided circuit board according to claim 1, further comprising forming a plurality of thin film pattern layers over the front surface of the substrate after the formation of the insulator protection film.

5. The method of producing a double-sided circuit board according to claim 4, further comprising subjecting the insulator protection film to a dry process so as to bore a penetrating hole through the insulator protection film when the electronic component is to be mounted.

6. The method of producing a double-sided circuit board according to claim 5, wherein a laser beam is employed to bore the penetrating hole.

7. A method of producing a double-sided circuit board including wiring patterns over front and back surfaces of a substrate, comprising:

forming an insulator protection film on the back surface of the substrate prior to formation of a thin film wiring pattern layer over the front surface of the substrate;

forming at least a thin film wiring pattern layer over the front surface of the substrate, keeping the insulator protection film on the back surface of the substrate; and boring a penetrating hole through the insulator protection film clinging to the back surface of the substrate.

8. The method of producing a double-sided circuit board according to claim 7, wherein a dry process is employed to bore the penetrating hole.

9. The method of producing a double-sided circuit board according to claim 8, wherein a laser beam is employed to bore the penetrating hole.

10. The method of producing a double-sided circuit board according to claim 7, further comprising forming a plurality of thin film wiring pattern layers over the front surface of the substrate after the formation of the insulator protection film.

11. The method of producing a double-sided circuit board according to claim 10, wherein a dry process is employed to bore the penetrating hole.

12. The method of producing a double-sided circuit board according to claim 11, wherein a laser beam is employed to bore the penetrating hole.

\* \* \* \* \*